United States Patent
Hegde

(10) Patent No.: US 8,440,507 B1
(45) Date of Patent: May 14, 2013

(54) LEAD FRAME SULFUR REMOVAL

(75) Inventor: Rama I. Hegde, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/400,405

(22) Filed: Feb. 20, 2012

(51) Int. Cl.
*H01L 21/44* (2006.01)

(52) U.S. Cl.
USPC .......................................... 438/123; 438/111

(58) Field of Classification Search ............... 438/111, 438/123
See application file for complete search history.

(56) References Cited

U.S. PATENT DOCUMENTS

| | | | |
|---|---|---|---|
| 4,065,851 A * | 1/1978 | Kummer et al. | 29/827 |
| 4,406,754 A | 9/1983 | Narita et al. | |
| 4,944,916 A * | 7/1990 | Franey | 422/8 |
| 2008/0083973 A1* | 4/2008 | Yamada et al. | 257/676 |
| 2009/0209121 A1* | 8/2009 | Kim et al. | 439/83 |
| 2011/0012159 A1* | 1/2011 | Yamada et al. | 257/98 |

OTHER PUBLICATIONS

Rodriguez et al.; "Adsorption of Sulfur on Ag/Al2O3 and Zn/Al2O3 Surfaces: Thermal Desorption, Photoemission, and Molecular Orbital Studies"; Journal of Physical Chemistry B; Apr. 17, 1997; pp. 3187-3195; 101 (16); ACS Publications.

Zakraysek; "The Incipient Melting of Silver in the Presence of Sulphur and Oxygen"; IEEE Transactions on Prts, Hybrids, and Packaging; Sep. 1971; pp. 124-133; IEEE.

"Oddy Test"; Art Conservation Research Center; 1 Pg; www.cmu.edu/arc/oddy_test.htm.

Chen et al.; "Silver sulfide nanoparticle assembly obtained by reacting an assembled silver nanoparticle template with hydrogen sulfide gas"; Nanotechnology; 2008; 11 pgs ; vol. 19, No. 5; IOP Science.

* cited by examiner

*Primary Examiner* — Alexander Ghyka
*Assistant Examiner* — Stanetta Isaac
(74) *Attorney, Agent, or Firm* — Joanna G. Chiu; David G. Dolezal

(57) ABSTRACT

A packaged electronic component and method of forming. The packaged electronic component is formed with a lead frame. The lead frame includes at least one silver structure. The silver structure attracts sulfur so as to inhibit sulfur contamination on the rest of the lead frame. In one example, the silver of the at least one silver structure has an average grain size thickness of one micron or less. In one embodiment, a sulfur removal process can be performed to remove sulfur from the silver structure.

16 Claims, 3 Drawing Sheets

LEAD FRAME SULFUR REMOVAL

BACKGROUND

1. Field

This disclosure relates generally to semiconductor processing, and more specifically, to sulfur removal from a lead frame.

2. Related Art

In semiconductor manufacturing, different packaging techniques may be used for packaging an electronic component. One known packaging technique is the use of lead frames. During manufacturing, when the lead frames are exposed to the ambient air or to chemical processing, sulfur contaminates the lead frames. These sulfur contaminates cause problems such as delamination and corrosion, which results in loss of yield.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

During the manufacturing process of forming a packaged electronic component which includes a lead frame, silver may be used to attract sulfur contaminants which typically form on a lead frame. The portion of the silver which attracted the sulfur contaminants may then be removed with a sulfur removal process. In one embodiment, the average grain size of the silver is kept at or below a 1 micron in order to better attract the sulfur contaminants. Also, in one embodiment, the sulfur removal process may include performing a dry etch or a low temperature hydrogen anneal of the lead frame prior to attaching the electronic component to the lead frame. As used herein, a lead frame can be any type of lead frame, such as a leaded lead frame or leadless lead frame. An example of a leadless lead frame is Quad Flat Package (QFN). The lead frame provides for die bonds and electronic assembly. In one embodiment, the electronic component can be electrically connected to the lead frame with a plurality of wire bonds.

Figure 1:
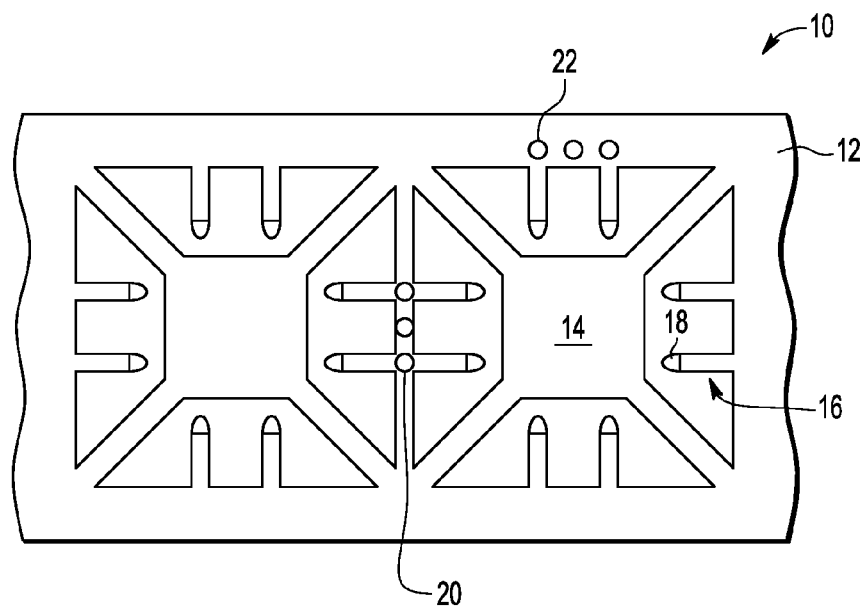
FIG. 1 illustrates a top down view of a portion of a lead frame assembly at a processing stage in accordance with one embodiment of the disclosure.
Figure 4:
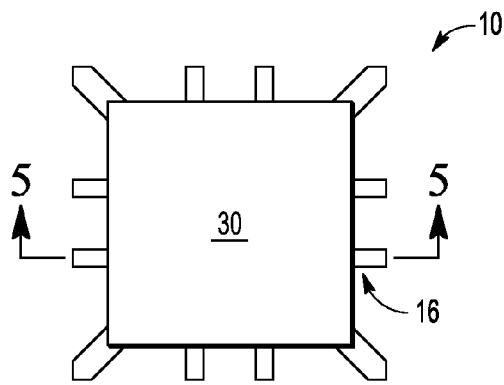
FIG. 4 illustrates a top down view of the lead frame assembly of FIG. 3 after singulation in accordance with one embodiment of the disclosure.
Figure 5:
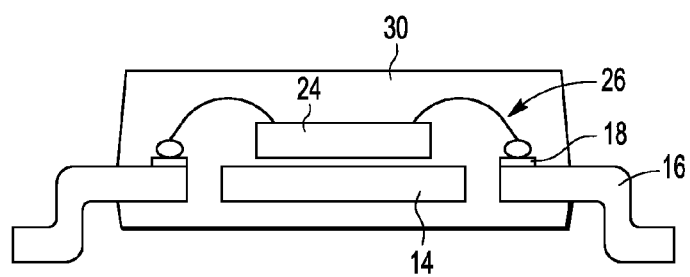
FIG. 5 illustrates a cross section view of the singulated lead frame assembly of FIG. 4 in accordance with one embodiment of the disclosure.
Figure 6:
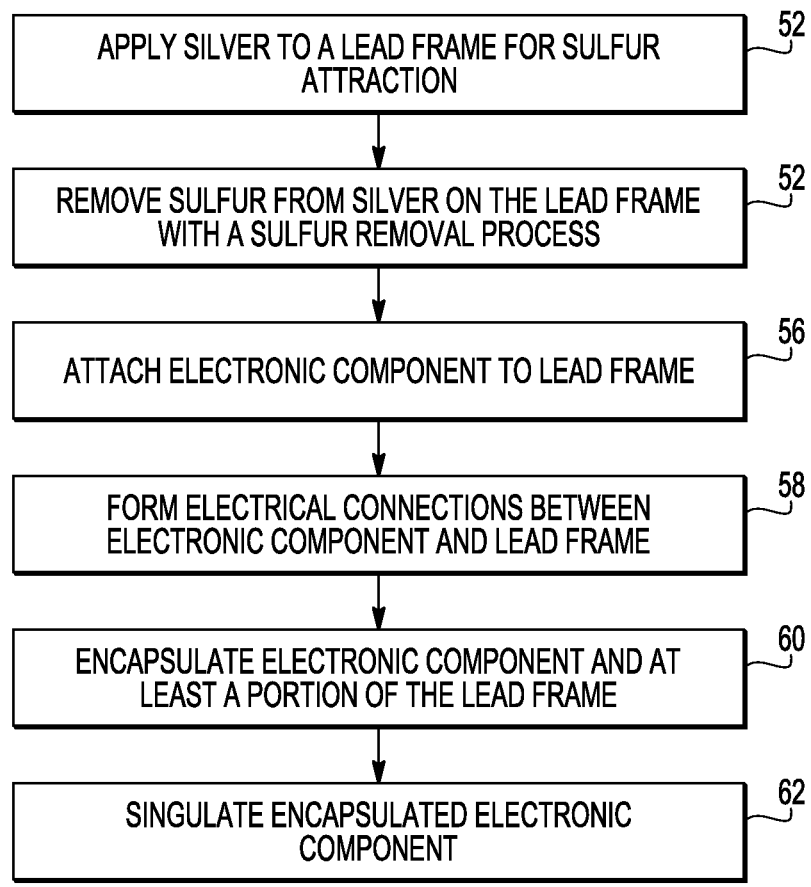
FIG. 6 illustrates, in flow diagram form, a method for forming a packaged electronic component in accordance with one embodiment of the disclosure.

FIG. 6 illustrates a flow diagram of a method 50 for forming a packaged electronic component, and FIGS. 1-5 will be described in reference to method 50 of FIG. 6. In FIG. 6, method 50 begins with block 52 in which silver is applied to a lead frame for sulfur attraction. Referring to FIG. 1, FIG. 1 illustrates a top down view of a portion of a lead frame assembly 10 in accordance with one embodiment. Lead frame assembly 10 includes a lead frame 12 with multiple flag portions (such as exemplary flag 14), each having a corresponding set of lead fingers (such as exemplary lead finger 16). In one embodiment, lead frame 12 is a copper lead frame. The portion of lead frame assembly 10 in FIG. 1 illustrates two locations of an array for two electronic assemblies. However, lead frame assembly 10 can be an array of any size (and may either be a one-dimensional array or a two-dimensional array) having any number of locations, each location having a corresponding flag portion and a corresponding set of lead fingers. In the illustrated embodiment, exemplary lead finger 16 corresponds to flag 14 such that lead finger 16 will be used to provide an electrical connection from lead finger 16 to an electronic component which will be attached to flag 14. Therefore, the lead fingers surrounding flag 14 form a set of lead fingers which correspond to flag 14. Also, each lead finger includes a silver structure, such as exemplary silver structure 18. In the illustrated embodiment, the silver structures are located at the tips of the lead fingers. In one embodiment, they are located at the wire bond regions of the lead fingers, in which a wire bond will be formed onto the silver. Also, lead frame 12 may include other silver structures, which may be referred to as silver dots, such as exemplary silver structures 20 and 22. These silver structures may be located in the saw streets of the lead frame assembly such that they will be separated from the packaged electronic components upon singulation. Alternatively, silver structures 20 and 22 may not be present, and only the lead fingers (or a subset of the lead fingers) will have the silver structures.

The silver structures, such as silver structures 18, 20, and 22, attract sulfur contaminates. This prevents the sulfur from being on the lead frame and lead fingers. The silver that is applied to the lead frame to form the silver structures has an average grain size of one micron or less. Alternatively, an average grain size of 0.15 microns or less may be used. The smaller the average grain size, the better the ability of the silver to attract the sulfur. In one embodiment, the silver structures, such as silver structures 18, 20, and 22, has a thickness of greater than one micron. Also, in one embodiment, the silver structures of lead frame 12 collectively have a total surface area of sufficient size to sufficiently reduce or inhibit sulfur contamination of lead frame 12 prior to subsequent attachment of an electronic component.

In one embodiment, lead frame 12 with the silver structures is received by a lead frame supplier which manufactures lead frame 12 and applies the silver. In this embodiment, an assembling entity, which may be different from the lead frame supplier, performs one or more of the remaining blocks of method 50, after block 52.

Referring back to FIG. 6, method 50 proceeds to block 54 in which the sulfur is removed from the silver on the lead frame with a sulfur removal process. In one embodiment, the sulfur is attracted to a surface portion of the silver. Different sulfur removal processes may be used to remove the sulfur from the silver structure. In one embodiment, a sputter etch is performed to remove the portion of the silver which contains the sulfur. For example, an ion sputter etch process may be used, such as an inert gas ion sputter etch. In one embodiment, the inert gas may be argon. The sputter etch process may be accomplished by 1-3 keV argon-ion bombardment. The operating argon pressure may be in the $10^{-6}$ to $10^{-7}$ Torr range in the chamber during the sputtering process. In another embodiment, a low temperature hydrogen anneal may be used to remove the sulfur from the silver. In this embodiment, the low temperature may be approximately 30 degrees Celsius or less. The anneal process may be accomplished at room temperature using ambient hydrogen pressure. Therefore, referring to FIG. 1, the sulfur removal process is applied to lead frame assembly 10 in order to remove the sulfur which was attracted by the silver.

Referring to FIG. 6, method 50 proceeds to block 56 in which an electronic component is attached to the lead frame. The electronic component can be any type of electronic component, such as, for example, an integrated circuit die or a circuit element. The electronic component may be attached using, for example, a die attach material. Method 50 proceeds to block 58 in which electrical connections are formed between the electronic component and the lead frame. That is, the electrical component is electrically coupled to the lead frame. In one embodiment, conductive structures of the electronic component (e.g. bond pads) are electrically coupled to the lead frame. In one embodiment, the electrical connections are formed with wire bond connections.

Figure 2:
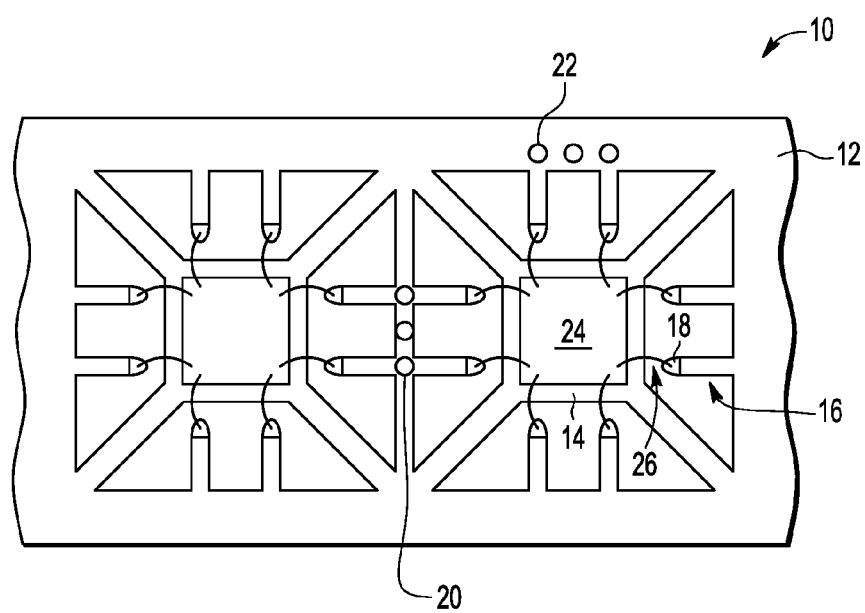
FIG. 2 illustrates a top down view of the lead frame assembly of FIG. 1 at a subsequent processing stage in accordance with one embodiment of the disclosure.

FIG. 2 illustrates a top down view of lead assembly 10 in which an electronic component has been attached and electrical connections formed, as described with respect to blocks 56 and 58 of FIG. 6. FIG. 2 includes an electronic component attached to each flag of lead frame 12, such as exemplary electronic component 24 attached to flag 14. Also included in FIG. 2 are wire bond connections from each lead finger to the corresponding electronic component. For example, exemplary wire bond connection 26 is connected to lead finger 16 and electronic component 24 to electrically coupled lead finger 16 to electronic component 24. In one embodiment, the ball bond of wire bond connection 26 is attached to silver structure 18 of lead finger 16. At this point, silver structure 18 has been cleaned of the sulfur. Silver structure 18 may be used to provide an improved wire bond connection.

Figure 3:
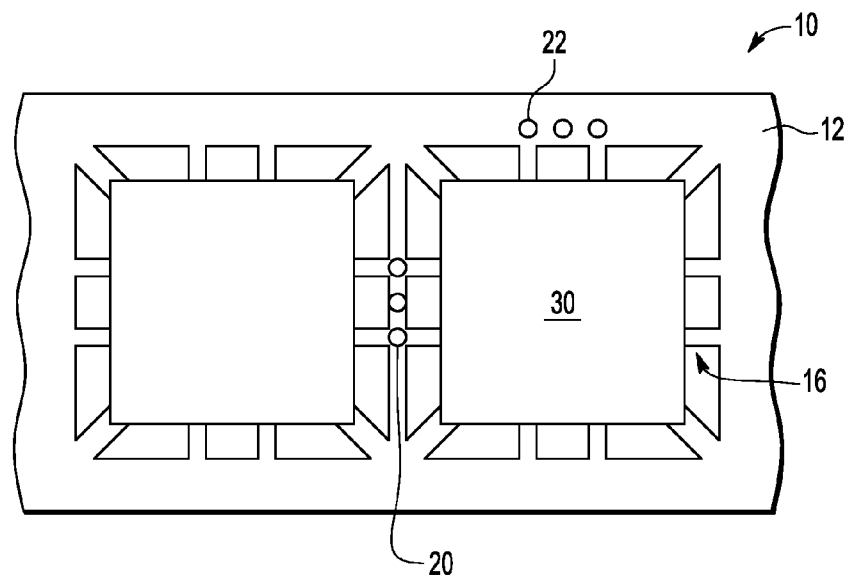
FIG. 3 illustrates a top down view of the lead frame assembly of FIG. 2 at a subsequent processing stage in accordance with one embodiment of the disclosure.

Referring back to FIG. 6, method 50 proceeds to block 60 in which the electronic component and at least a portion of the lead frame is encapsulated. Note that the electronic connections between the lead fingers and the electronic component, e.g. the wire bond connections, are also encapsulated. For example, referring to FIG. 3, FIG. 3 illustrates a top down view of lead assembly 10 after encapsulation. For example, encapsulant 30 encapsulates electronic component 24, the wire bond connections, such as wire bond connection 26, and at least a portion of the lead fingers. In the illustrated embodiment, the portion of the lead fingers that is encapsulated includes the silver structures located at the tips of the lead fingers. Another portion of the lead fingers extends laterally outwards from the encapsulation. Note that those silver structures located elsewhere on lead frame 20, such as silver structures 20 and 22, are not covered by the encapsulation. That is, these silver structures remain exposed after encapsulation.

Referring back to FIG. 6, method 50 proceeds to block 62 in which the encapsulated electronic components are singulated to form packaged electronic components. For example, referring to FIG. 4, FIG. 4 illustrates lead assembly 10 after singulation in which electronic component 24 encapsulated by encapsulant 30 has been singulated and may be referred to as a packaged electronic component. Note that in the illustrated embodiment, after singulation, a portion of each lead finger extends outwardly from the encapsulation. Therefore, FIG. 4 represents a leaded lead frame embodiment. In a leadless lead frame embodiment, after singulation, the lead fingers would not extend outwardly from the encapsulation and would be within the encapsulation. FIG. 5 illustrates a cross sectional view of the packaged electronic component of FIG. 4. Note that, after singulation, the exposed lead fingers may be bent or further bent as needed for subsequent attachment to a printed circuit board. Also, note that during singulation, some silver structures, such as silver structures 20 and 22, are removed from the packaged electronic component. Therefore, in one embodiment in which silver structures are not applied to the lead fingers (such as silver structure 18) and are instead only applied in the saw street areas, the sulfur removal process of block 54 of method 50 need not be performed because the sulfur is instead removed by singulation in block 62.

By now it should be appreciated that there has been provided a method for removing sulfur from a lead frame during the fabrication of a packaged electronic component. Silver may be applied to a lead frame (or a lead frame with silver may be provided) which attracts or accumulates sulfur. This sulfur may then be removed by a sulfur removal process or by singulation (dependent upon the location of the sulfur structures). In this manner, sulfur contamination may be reduced and thus yield may be improved.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different types of lead frames may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming a packaged electronic component, the method including: performing a sulfur removal process on a lead frame with at least one silver structure to remove sulfur from the at least one silver structure; attaching an electronic component to the lead frame; electrically coupling at least one conductive structure of the electronic component to the lead frame; and encapsulating the electronic component and at least a portion of the lead frame. Item 2 includes the method of item 1 wherein the sulfur removal process includes a low temperature hydrogen anneal process. Item 3 includes the method of item 1 wherein the sulfur removal process includes a sputter etch process. Item 4 includes the method of item 3 wherein the sputter etch process is characterized as an ion sputter etch process. Item 5 includes the method of item 4 wherein the ion sputter etch process is characterized as an inert gas ion sputter etch process. Item 6 includes the method of item 5 wherein the inert gas ion sputter etch process is characterized as an argon ion sputter etch process. Item 7 includes the method of item 1 wherein the at least one silver structure includes silver, wherein the sliver of the at least one silver structure has an average grain size of one micron or less. Item 8 includes the method of item 7 wherein the sliver of the at least one silver structure has an average grain size of 0.15 microns or less. Item 9 includes the method of item 1 wherein all of the at least one silver structure has a total surface area of sufficient size to inhibit sulfur contamination of a remaining portion of the lead frame prior to the attachment of the electronic component. Item 10 includes the method of item 1 and further includes attaching at least one other electronic component to the lead frame; singulating the lead frame to form a plurality of electronic component packages each with at least one electronic component, wherein at least one silver structure of the at least one silver structure is not in any of the electronic component packages formed from singulating the lead frame. Item 11 includes the method of item 1 and further includes receiving the lead frame from a lead frame supplier; wherein the performing a sulfur removal process is performed after the lead frame is received from the lead frame supplier but before the electronic component is attached to the lead frame.

Item 12 includes a method of forming a packaged electronic component including: attaching an electronic component to a lead frame with at least one silver structure, wherein the at least one silver structure includes silver, wherein the sliver of the at least one silver structure has an average grain size of one micron or less; electrically coupling at least one conductive structure of the electronic component to the lead frame; encapsulating the electronic component and at least a portion of the lead frame. Item 13 includes the method of item 12 wherein the sliver of the at least one silver structure has an average grain size of 0.15 microns or less. Item 14 includes the method of item 12 and further includes performing a sulfur removal process on the lead frame to remove sulfur from the at least one silver structure. Item 15 includes the method of item 12 wherein the at least one silver structure has a thickness of greater than one micron. Item 16 includes the method of item 12 and further includes attaching at least one other electronic component to the lead frame; singulating the lead frame to form a plurality of electronic component packages each with at least one electronic component, wherein at least one silver structure of the at least one silver structure is not in any of the electronic component packages formed from singulating the lead frame.

Item 17 includes an electronic component package including: a lead frame; an electronic component attached to the lead frame and including at least one structure electrically coupled to the lead frame; an encapsulant encapsulating the electronic component and at least a portion of the lead frame; at least one silver structure attached to the lead frame, the at least one silver structure includes silver, wherein the sliver of the at least one silver structure has an average grain size of one micron or less. Item 18 includes the electronic component package of claim 17 wherein the sliver of the at least one silver structure has an average grain size of 0.15 microns or less. Item 19 includes the electronic component package of claim 17 and further includes a wire bond, the wire bond attached to a silver structure of the at least one silver structure.

Item 20 includes the electronic component package of claim 17 wherein the at least one silver structure has a thickness of greater than one micron.

What is claimed is:

1. A method of forming a packaged electronic component, the method comprising:
    performing a sulfur removal process on a lead frame with at least one silver structure to remove sulfur from the at least one silver structure;
    attaching an electronic component to the lead frame;
    electrically coupling at least one conductive structure of the electronic component to the lead frame;
    encapsulating the electronic component and at least a portion of the lead frame.

2. The method of claim 1 wherein the sulfur removal process includes a low temperature hydrogen anneal process.

3. The method of claim 1 wherein the sulfur removal process includes a sputter etch process.

4. The method of claim 3 wherein the sputter etch process is characterized as an ion sputter etch process.

5. The method of claim 4 wherein the ion sputter etch process is characterized as an inert gas ion sputter etch process.

6. The method of claim 5 wherein the inert gas ion sputter etch process is characterized as an argon ion sputter etch process.

7. The method of claim 1 wherein the at least one silver structure includes silver, wherein the sliver of the at least one silver structure has an average grain size of one micron or less.

8. The method of claim 7 wherein the sliver of the at least one silver structure has an average grain size of 0.15 microns or less.

9. The method of claim 1 wherein all of the at least one silver structure has a total surface area of sufficient size to inhibit sulfur contamination of a remaining portion of the lead frame prior to the attachment of the electronic component.

10. The method of claim 1 further comprising:
    attaching at least one other electronic component to the lead frame;
    singulating the lead frame to form a plurality of electronic component packages each with at least one electronic component, wherein at least one silver structure of the at least one silver structure is not in any of the electronic component packages formed from singulating the lead frame.

11. The method of claim 1 further comprising:
    receiving the lead frame from a lead frame supplier;
    wherein the performing a sulfur removal process is performed after the lead frame is received from the lead frame supplier but before the electronic component is attached to the lead frame.

12. A method of forming a packaged electronic component comprising:
    attaching an electronic component to a lead frame with at least one silver structure, wherein the at least one silver structure includes silver, wherein the sliver of the at least one silver structure has an average grain size of one micron or less;
    electrically coupling at least one conductive structure of the electronic component to the lead frame;
    encapsulating the electronic component and at least a portion of the lead frame.

13. The method of claim 12 wherein the sliver of the at least one silver structure has an average grain size of 0.15 microns or less.

14. The method of claim 12 further comprising performing a sulfur removal process on the lead frame to remove sulfur from the at least one silver structure.

15. The method of claim 12 wherein the at least one silver structure has a thickness of greater than one micron.

16. The method of claim 12 further comprising:
    attaching at least one other electronic component to the lead frame;
    singulating the lead frame to form a plurality of electronic component packages each with at least one electronic component, wherein at least one silver structure of the at least one silver structure is not in any of the electronic component packages formed from singulating the lead frame.

* * * * *